United States Patent [19]
Wen et al.

[11] Patent Number: 5,702,532
[45] Date of Patent: Dec. 30, 1997

[54] MOCVD REACTOR SYSTEM FOR INDIUM ANTIMONIDE EPITAXIAL MATERIAL

[75] Inventors: Cheng P. Wen, Mission Viejo; Randy K. Rolph, Palos Verdes Estates; Timothy T. Zielinski, Torrance, all of Calif.

[73] Assignee: Hughes Aircraft Company, Los Angeles, Calif.

[21] Appl. No.: 606,660

[22] Filed: Feb. 26, 1996

Related U.S. Application Data

[63] Continuation of Ser. No. 455,941, May 31, 1995, abandoned.

[51] Int. Cl.[6] ................................................. C23C 16/00
[52] U.S. Cl. ........................... 118/730; 118/715; 118/726
[58] Field of Search .................................. 118/726, 730, 118/715

[56] References Cited

U.S. PATENT DOCUMENTS

| | | | |
|---|---|---|---|
| 3,783,822 | 1/1974 | Wollam | 118/49.1 |
| 3,853,091 | 12/1974 | Christensen | 118/49 |
| 4,582,480 | 4/1986 | Lynch | 432/1 |
| 4,704,988 | 11/1987 | Mellet | 118/726 |
| 4,851,256 | 7/1989 | Matsuyama | 427/39 |
| 4,860,687 | 8/1989 | Frijlink | 118/500 |
| 4,911,101 | 3/1990 | Ballingall, III | 118/715 |
| 4,980,204 | 12/1990 | Fujii | 427/255.2 |
| 5,203,925 | 4/1993 | Shibuya | 118/724 |
| 5,211,758 | 5/1993 | Ota | 118/722 |
| 5,227,340 | 7/1993 | Pintchovski | 437/225 |
| 5,334,277 | 8/1994 | Nakamura | 117/102 |
| 5,380,367 | 1/1995 | Bertone | 118/726 |
| 5,421,895 | 6/1995 | Tsubouchi | 118/726 |
| 5,468,299 | 11/1995 | Tsai | 118/730 |

FOREIGN PATENT DOCUMENTS

| | | | |
|---|---|---|---|
| 0204182 | 12/1986 | European Pat. Off. | 118/726 |
| 167293 | 7/1987 | Japan | 118/726 |
| 175225 | 7/1989 | Japan | 118/726 |
| 45592 | 2/1991 | Japan | 118/726 |
| 227011 | 10/1991 | Japan | 118/726 |
| 72717 | 3/1992 | Japan | 118/726 |
| 76623 | 3/1992 | Japan | 118/726 |
| 132229 | 8/1994 | Japan | |

OTHER PUBLICATIONS

Powell, Carroll; Oxley, Joseph; Blocher, John; Vapor Deposition, 1966 pp. 269–276.

*Primary Examiner*—Richard Bueker
*Assistant Examiner*—Jeffrie R. Lund
*Attorney, Agent, or Firm*—M. E. Lachman; M. W. Sales; W. K. Denson-Low

[57] ABSTRACT

Multiple solid precursor bubblers are used to alleviate channeling effects caused by high carrying gas flow rates to provide for deposition of indium-based epitaxial materials in high-capacity MOCVD reactor systems. Precracking of precursor materials that exhibit higher dissociation temperatures using heated manifolds or heated susceptor, and rotation of individual wafers in a multi-wafer reactor chamber enhance thickness uniformity, surface morphology and electronic properties of deposited epitaxial layers.

6 Claims, 2 Drawing Sheets

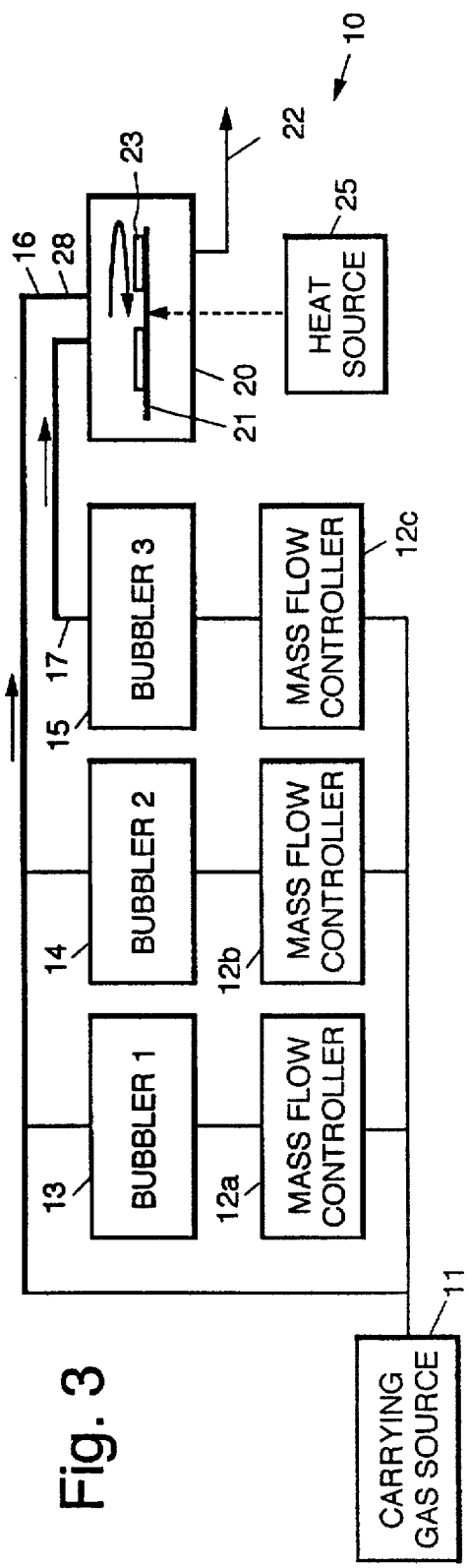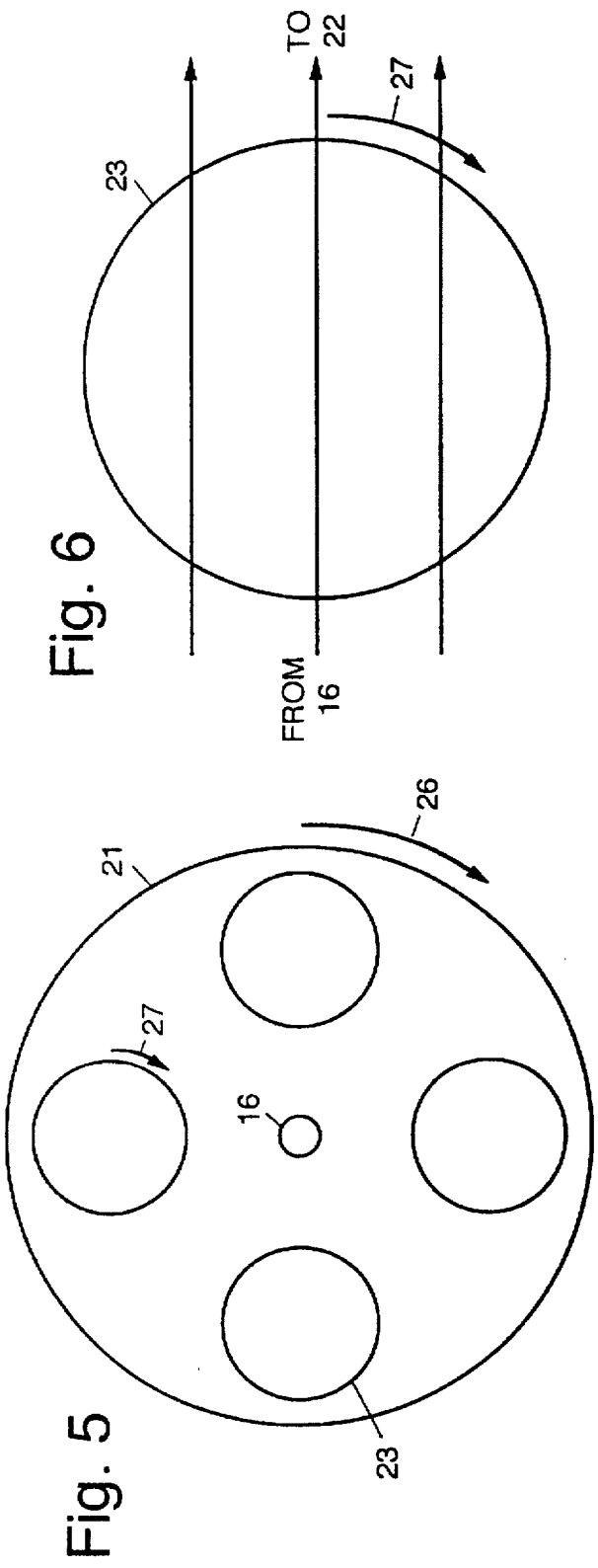

MOCVD REACTOR SYSTEM FOR INDIUM ANTIMONIDE EPITAXIAL MATERIAL

This is a continuation of application Ser. No. 08/455,941, filed May 31, 1995, now abandoned.

BACKGROUND OF THE INVENTION

The present invention generally relates to MOCVD reactors, and more particularly, to an improved MOCVD reactor system for use with indium antimonide epitaxial material.

Conventional MOCVD reactors designed for typical III-V compound semiconductor material growth, such as gallium arsenide and aluminum gallium arsenide, and the like, are not compatible with high volume indium antimonide device material manufacturing, where the quality of the epitaxial material is extremely sensitive to the ratio of indium and antimony. Precision control of organic metallic indium and antimony flux ratios under high growth rate conditions is difficult to maintain because of problems associated with solid precursor materials such as trimethyl indium. Epitaxial indium antimonide film thickness uniformity and good surface morphology are practically unobtainable in conventional production MOCVD systems with multiple, large-area (3-inch diameter or larger) wafer capacity.

Metal organic chemical vapor phase deposition (MOCVD) techniques are used to prepare semiconductor electronics and optoelectronics device materials. Production reactor systems with multiple large wafer capability are commonly employed to manufacture III-V compound semiconductor based solar cells, transistors (including heterojunction bipolar transistors and field effect transistors) and monolithic integrated circuits. Despite the success stories, the conventional MOCVD reactor is not fully compatible with epitaxial indium antimonide (InSb) growth over large substrate areas. Preparation of arsenic based compounds is enhanced by the property of arsenic, an arsenic atom does not attach to another arsenic atom in a typical MOCVD reactor environment where the substrate temperature is in the 600° C. to 700° C. range. For instance, the epitaxial gallium arsenide deposition rate is solely controlled by the gallium precursor flux density while the substrate is kept in an arsenic overpressure environment. On the other hand, an antimony atom will attach to another antimony atom in the epitaxial reactor environment, making it extremely critical to maintain a constant indium to antimony flux ratio over the entire substrate surface for InSb deposition. Excess indium or excess antimony will lead to poor epilayer surface morphology and/or poor electronic properties (electron mobility in particular).

In a typical conventional MOCVD reactor, both group III (In) and group V (Sb) precursors are injected into a reactor chamber from a common manifold, while the flow rate of the carrying gas for each precursor is controlled separately using its own mass flow controller. There is one bubbler (or container) for each precursor (source) and dopant material. The growth rate of the epitaxial layers is proportional to the flux of the precursors under normal reactor operating conditions. Higher epitaxial material deposition rate and multiple wafer reactor operation demands higher precursor flux, which is realized by increasing carrying gas flow through the bubblers.

In addition to the antimony related problem, fluctuation of the indium precursor flux from a solid source (trimethyl indium) induced by the channeling effect in the bubbler (container for the organic metallic source material) under high carrier gas flow conditions can cause uncertainty in the epitaxial growth rate and severe surface morphology degradation. Also, MOCVD epitaxial material often exhibits nonuniform electrical properties (such as sheet resistivity, carrier concentration or carrier mobility) across a wafer surface caused by thickness and composition stoichiometry variations.

In the conventional MOCVD reactor, near the inlet of the reactor chamber, a precursor with a lower dissociation temperature (indium) cracks first, leading to an indium rich environment and very poor epitaxial film surface morphology. The flux ratio becomes acceptable at some distance from the reactor inlet because the indium is gradually depleted while the availability of antimony increases, leading to high quality indium antimonide epitaxial material in this zone. The mixed precursor flux becomes increasingly antimony rich down stream. Excess antimony eventually will deposit out, resulting in a cloudy looking epilayer surface. The end result is an epitaxial InSb layer with a "sweet zone" sandwiched between indium rich and an antimony rich regions, limiting the capability to achieve featureless high quality epitaxial device material over large area substrates.

Also, the thickness uniformity of the epitaxial material prepared in a conventional MOCVD reactor is dictated by the availability of the group III precursor material (indium) in indium antimonide growth. Depletion of indium with distance from the reactor inlet typically resulted in significant thickness variation (1.4 to 1 over a distance of 5 centimeters) of InSb film growth in a conventional MOCVD reactor.

Therefore, in view of the above-described problems relating to conventional MOCVD reactors, it is an objective of the present invention to provide for an improved MOCVD reactor system for use with indium antimonide epitaxial material.

SUMMARY OF THE INVENTION

In order to meet the above and other objectives, the present invention is an improved high capacity metal organic chemical vapor phase deposition (MOCVD) reactor system for use with indium antimonide epitaxial material. The present reactor system uses an improved gas handling system using solid precursor source material for multiple large-area III-V compound semiconductor materials (indium antimonide) epitaxial material growth. Multiple metal organic precursor material bubblers (containers) are employed to maintain a constant indium precursor flux which is critical for high quality InSb epitaxial layer deposition. The antimony precursor is precracked because it has a much higher dissociation temperature than that of the indium precursor. In addition, each substrate is disposed on a common rotating susceptor and also rotates around its own axis at a high enough angular velocity so that there is less than one monolayer of precursor material deposition per revolution. The local (up stream versus downstream) nonstoichiometry mixture of precursor species and local growth rate difference average out due to the rotation of the substrates.

The present invention thus provides an improved MOCVD reactor system for epitaxial indium antimonide growth in a manufacturing environment where high growth rate and multiple large area wafer operation is essential. The present invention alleviates indium flux fluctuation (or decay) commonly encountered in conventional high rate MOCVD epitaxial growth when a solid metallic organic precursor is employed. In addition, the present invention allows the growth of uniform, high quality (good surface morphology, high carrier mobility) indium antimonide material over the entire surface of multiple large (3-inch or 4-inch diameter) wafers using precursors with significantly different cracking temperature and finite sticking coefficients in the epitaxial reactor environment.

The present invention has immediate benefits for magnetoresistance (MR) sensor manufacturing processes, such as those used to produce automotive ignition timing control circuits, power steering control circuits, brushless windshield wiper motors, and braking and suspension systems, and the like.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 3 illustrates an embodiment of the MOCVD reactor system that implements precracking in accordance with the principles of the present invention;

FIG. 5 is a top view of a rotating susceptor for multiple individual wafers employed in the reactor system of the present invention; and FIG. 6 is a top view of a rotating wafer that averages deposition effects in the reactor system of the present invention.

DESCRIPTION OF THE PREFERRED EMBODIMENTS

Figure 1:
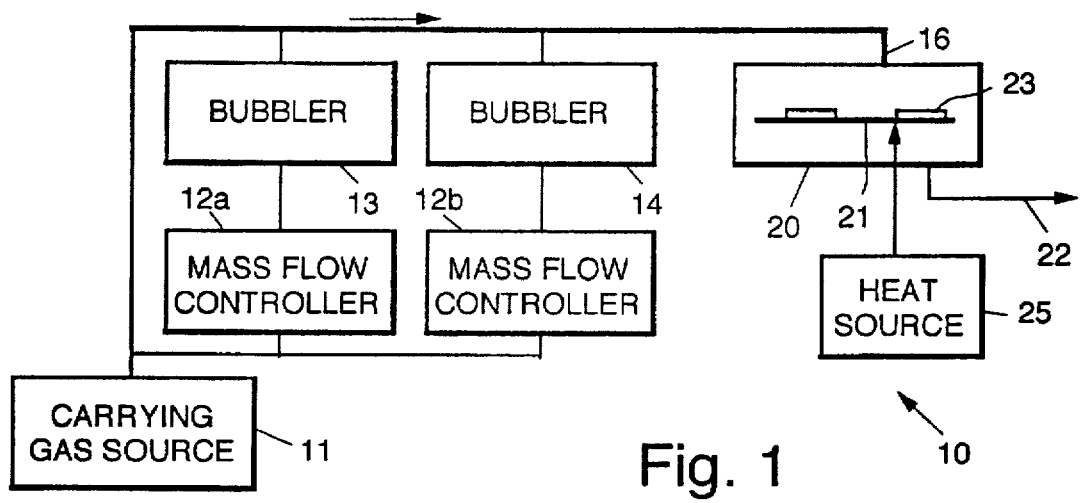
FIG. 1 illustrates a first embodiment of a MOCVD reactor system for use with indium antimonide epitaxial material in accordance with the principles of the present invention.

The problems related to epitaxial indium antimonide preparation using organic precursors discussed in the Background section are alleviated using an improved metal organic chemical vapor phase deposition (MOCVD) reactor system 10 described below. Referring to the drawing figures, FIG. 1 illustrates a first embodiment of a MOCVD reactor system 10 for use in depositing indium antimonide epitaxial material layers in accordance with the principles of the present invention. The MOCVD reactor system 10 is used to deposit an indium antimonide epitaxial layer on multiple large area wafers 23. The MOCVD reactor system 10 comprises a carrying gas (hydrogen) source 11 that provides hydrogen carrying gas to inputs of first and second parallel mass flow controllers 12a, 12b that control the flow rate of carrying gas applied to first, and second parallel solid precursor bubblers 13, 14, respectively. The solid precursor bubblers 13, 14 contain trimethyl indium (TMI), for example.

Outputs of the first and second bubblers 13, 14 are combined with hydrogen carrying gas from the carrying gas source 11 and coupled by way of a first manifold 16 to a reactor chamber 20. The reactor chamber 20 has a heatable and rotatable susceptor(s) 21 for precracking precursor materials flowing into the reactor chamber 20. A heat source 25 is coupled to the rotatable susceptor 21 for heating it to achieve precursor cracking. Exhaust gasses from the reactor chamber 20 are removed by way of an exhaust vent 22.

Figure 2:
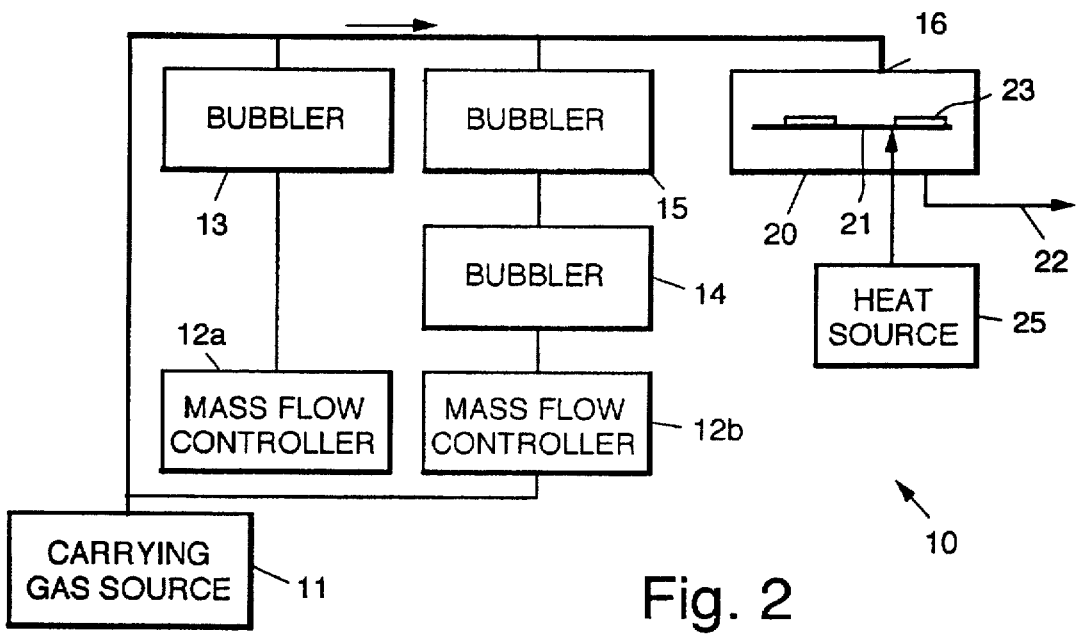
FIG. 2 illustrates a second embodiment of the MOCVD reactor system in accordance with the principles of the present invention.

FIG. 2 illustrates a second embodiment of the MOCVD reactor system 10 in accordance with the principles of the present invention. The second MOCVD reactor system 10 comprises the carrying gas source 11 that provides carrying gas (hydrogen) to inputs of first and second parallel mass flow controllers 12a, 12b. The first mass flow controller 12a controls the flow rate of carrying gas applied to a first solid precursor bubbler 13. The second mass flow controller 12b controls the flow rate of carrying gas applied to second and third serially connected solid precursor bubblers 14, 15.

Outputs of the first and third bubblers 13, 15 are combined with carrying gas from the carrying gas source 11 and coupled by way of the manifold 16 to the reactor chamber 20. The reactor chamber 20 includes the rotatable susceptor 21, and the heat source 25 is coupled to the rotatable susceptor 21 to heat it and provide precursor cracking.

FIG. 3 illustrates another embodiment of the MOCVD reactor system 10 that implements precracking in accordance with the principles of the present invention. Outputs of first and second parallel bubblers 13, 14 are coupled to the reactor chamber 20 by way era first heated manifold 16, while the output of the third bubbler 15 is coupled to the reactor chamber 20 by way of a second heated manifold 17.

Figure 4:
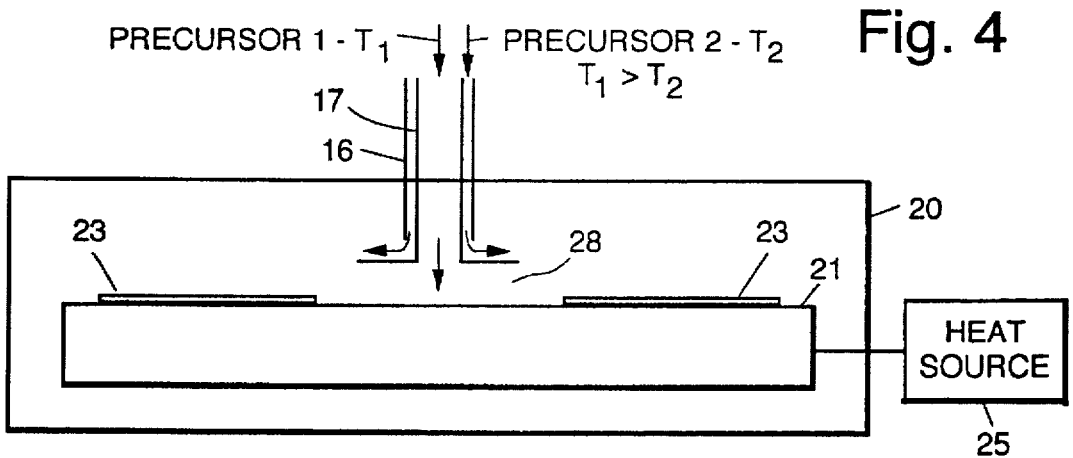
FIG. 4 is a cross section of the reactor chamber of FIG. 3 and shows precracking employed in the present invention.

FIG. 4 is a cross section of the reactor chamber 20 of FIG. 3 and illustrates precracking employed in the reactor system 10 by means of the heated manifolds 16, 17. The manifold 16 surrounds the manifold 17 as is shown in FIG. 4. The rotatable susceptor 21 is shown having two substrates 23 or wafers 23 disposed thereon. The first and second heated manifolds 16, 17 are shown that input the two different precursors into the reactor chamber 20 from the respective bubblers 13, 14, 15. The first precursor (precursor 1) derived from the first and second bubblers 13, 14 is heated by the first heated manifold 16 to a first temperature $T_1$, while the second precursor (precursor 2) derived from the third bubbler 15 is heated by the second heated manifold 17 to a second temperature $T_2$, wherein $T_2 > T_1$.

FIG. 5 is a top view of a rotating susceptor 21 used to process multiple individual wafers 23 in the reactor system 10 of the present invention. The susceptor 21 is caused to rotate (illustrated by arrow 26) and move the wafers 23 within the chamber 20 during deposition of the epitaxial layer thereon. Each individual wafer 23 may also rotate (illustrated by arrow 27) around its center so that precursor material is caused to deposit more evenly over time on its surface.

FIG. 6 is an enlarged top view of a rotating wafer 23 that averages deposition effects in the reactor systems 10 shown in FIGS. 1-3. The wafer 23 is rotated (illustrated by arrow 27) around its center so that precursor material deposits more evenly on its surface over time.

The present high capacity MOCVD reactor system 10 is primarily adapted for use in depositing indium antimonide epitaxial layers onto wafers 23 or substrates 23. In operation, multiple solid precursor bubblers containing trimethyl indium precursor material, for example, are used to accommodate a high gas flow rate to achieve a high epitaxial growth rate. This alleviates the channeling effect often encountered by conventional one-bubbler-per-precursor-type reactor systems. Two different reactor systems 10 may be employed as are shown in FIGS. 1 and 2 and described above.

Two or more bubblers 13, 14 having individual mass flow controllers 12a, 12b for the carrying gas are connected in parallel (FIG. 1) to reduce the flow in each of the bubblers 13, 14 to a "safe" level. All the outlets of the bubblers 13, 14 are connected to the input manifold 16 of the reactor chamber 20 at the same place. The path lengths of the carrying gas (hydrogen) are made substantially identical to allow a step function discontinuity of precursor flux injection into the reactor chamber 20. The "safe" level is determined empirically, depending on the size and the configuration of the respective bubbler 13, 14. It has been found that a cylindrical bubbler 13, 14 with a 200 gram trimethyl indium capacity and 50 mm internal diameter can safely handle a 165 cc/minute carrying gas flow rate without producing the channeling effect.

Two bubblers 14, 15 (upstream and downstream bubblers 14, 15) may be immersed in different temperature baths that are connected in series with a single mass flow controller 12b (FIG. 2). The temperature of the upstream bubbler 14 is maintained at a few degrees Centigrade warmer than the downstream bubbler 15. The carrying gas picks up precursor vapor from the upstream bubbler 14; but the gas becomes supersaturated with the precursor vapor once it enters into the cooler downstream bubbler 15. Channels are created by the supersaturated carrying gas; instead, excess precursor material is deposited in the downstream bubbler 15. The series connected bubblers 14, 15 provide carrying gas saturated with a constant precursor vapor pressure corresponding to the bath temperature of the downstream bubbler 15, thus providing a constant indium flux to the MOCVD reactor chamber 20.

In the embodiment shown in FIG. 3, each precursor material is introduced into the reactor chamber 20 through a separate inlet manifold 16, 17. The precursor that requires a higher cracking temperature is precracked. The flux is passed through a high temperature zone before it reaches the wafers 23 where epitaxial growth of stoichiometry compound semiconductor takes place. Precracking may be accomplished using the heated manifolds 16, 17 before the precursor material enters the reactor chamber 20 (FIG. 3). An alternative approach is to use a portion of the heated susceptor 21 as the precracking zone 28 as is illustrated in FIG. 4 by supplying heat from the heat source 25. The use of a separate inlet manifold 16, 17 for each precursor material combined with precracking of one or more of the precursor materials helps to maintain an acceptable precursor flux ratio over a larger area in the reactor chamber 20, a necessary condition for high quality indium antimonide epitaxial layer growth.

Each susceptor 21 in the multiple wafer MOCVD reactor chamber 20 revolves around its own axis (FIG. 5 and FIG. 6) during epitaxial layer deposition. The rotational motion serves to even up the thickness variation of the epitaxial layer across the surface of the wafer 23 caused by gradual depletion of precursor material from the inlet manifold 16, 17 to the exhaust vent 22 of the reactor chamber 20. The minimum rotating speed for the wafers 23 is selected to provide an averaging effect for the precursor materials deposited on the surface of each wafer 23 such that the indium rich upstream deposition mixes with the antimony rich downstream deposition if the wafer 23 rotates faster than 360° per atomic layer growth. For instance, if the growth rate of InSb is 6,000 Angstrom per hour, this is equivalent to a deposition rate of approximately 20 atomic layers per minute (assuming an atomic layer is 5 Angstroms thick). The wafers 23 rotate at a minimum rate of 20 revolution per minute.

Thus, the present invention provides for the use of multiple solid precursor bubblers 13, 14, 15 to alleviate the channeling effect caused by high carrying gas flow rates to provide for deposition of indium-based epitaxial materials in high-capacity MOCVD reactor systems 10. In addition, precracking of precursor materials that exhibit a higher dissociation temperature, and rotation of individual wafers 23 in a multi-wafer reactor chamber 20 serve to enhance thickness uniformity, surface morphology and electronic properties of deposited epitaxial indium antimonide layers.

Thus, improved MOCVD reactor systems for use with indium antimonide epitaxial material have been described. It is to be understood that the above-described embodiments are merely illustrative of some of the many specific embodiments which represent applications of the principles of the present invention. Clearly, numerous and other arrangements can be readily devised by those skilled in the art without departing from the scope of the invention. While the present invention has been described with reference to the deposition of indium antimonide, it is to be understood that the present invention may be advantageously employed to deposit other III-V epitaxial materials.

What is claimed is:

1. A metal organic chemical vapor deposition reactor system for depositing epitaxial material layers on a plurality of wafers, said system consisting of:

(a) a carrying gas source for providing carrying gas;

(b) a plurality of mass flow controllers coupled to the carrying gas source;

(c) a first bubbler for a first solid precursor, coupled to a first of the plurality of mass flow controllers wherein the first solid precursor provides a first reactant;

(d) a second bubbler for a second solid precursor, coupled to a second of the plurality of mass flow controllers wherein the second solid precursor provides a second reactant;

(e) a third bubbler for a third solid precursor, coupled to a third of the plurality of mass flow controllers wherein the third solid precursor provides a third reactant;

(f) a first manifold having a first input coupled to the carrying gas source and second and third inputs coupled to outputs of the first and second bubblers respectively;

(g) a second manifold having a first input coupled to the carrying gas source and a second input coupled to an output of the third bubbler;

(h) a reactor chamber having a first input coupled to an output of the first manifold and a second input coupled to an output of the second manifold wherein a mixture of the first and second reactants enters the reactor chamber through the first input thereof and the third reactant enters the reactor chamber through the second input thereof;

(i) a rotatable susceptor disposed within the reactor chamber for supporting said wafers and rotating said wafers about the axis of said susceptor; and (j) means for rotating each wafer of said plurality of wafers about the center of each said wafer.

2. The system of claim 1 wherein the carrying gas comprises hydrogen.

3. The system of claim 1 wherein at least one of the bubblers contains trimethyl indium.

4. The system of claim 1 wherein the first and second solid precursors consist of the same material.

5. A metal organic chemical vapor deposition reactor system for depositing epitaxial material layers on a plurality of wafers, said system consisting of:

(a) a carrying gas source for providing carrying gas;

(b) a plurality of mass flow controllers coupled to the carrying gas source;

(c) a first bubbler for a first solid precursor, coupled to a first of the plurality of mass flow controllers wherein the first solid precursor provides a first reactant;

(d) a second bubbler for a second solid precursor, coupled to a second of the plurality of mass flow controllers wherein the second solid precursor provides a second reactant;

(e) a third bubbler for a third solid precursor, coupled to a third of the plurality of mass flow controllers wherein the third solid precursor provides a third reactant;

(f) a first manifold having a first input coupled to the carrying gas source and second and third inputs coupled to outputs of the first and second bubblers respectively;

(g) a second manifold having a first input coupled to the carrying gas source and a second input coupled to an output of the third bubbler;

(h) a reactor chamber having a first input coupled to an output of the first manifold and a second input coupled to an output of the second manifold wherein a mixture of the first and second reactants enters the reactor chamber through the first input thereof and the third reactant enters the reactor chamber through the second input thereof;

(i) a rotatable susceptor disposed within the reactor chamber for supporting said wafers and rotating said wafers about the axis of said susceptor;

(j) means for rotating each wafer of said plurality of wafers about the center of each said wafer; and (k) a heat source coupled to the rotatable susceptor for creating a precracking zone on the susceptor to precrack one or more of the precursors which have entered the reactor chamber.

6. A metal organic chemical vapor deposition reactor system for depositing epitaxial material layers on a plurality of wafers, said system consisting of:

(a) a carrying gas source for providing carrying gas;

(b) a plurality of mass flow controllers coupled to the carrying gas source;

(c) a first bubbler for a first solid precursor, coupled to a first of the plurality of mass flow controllers wherein the first solid precursor provides a first reactant;

(d) a second bubbler for a second solid precursor, coupled to a second of the plurality of mass flow controllers wherein the second solid precursor provides a second reactant;

(e) a third bubbler for a third solid precursor, coupled to the second bubbler wherein the third solid precursor provides a third reactant;

(f) a manifold having a first input coupled to the carrying gas source and second and third inputs coupled to outputs of the first and third bubblers respectively;

(g) a reactor chamber having an input coupled to an output of the manifold wherein a mixture of the first, second, and third reactants enters the reactor chamber through the input of the reactor chamber;

(h) a rotatable susceptor disposed within the reactor chamber for supporting said plurality of wafers and rotating said wafers about the axis of said susceptor; and (j) means for rotating each wafer of said plurality of wafers about the center of each said wafer.

* * * * *